United States Patent
Okamoto et al.

(10) Patent No.: US 9,530,879 B2
(45) Date of Patent: *Dec. 27, 2016

(54) SEMICONDUCTOR DEVICE AND FIELD EFFECT TRANSISTOR WITH CONTROLLABLE THRESHOLD VOLTAGE

(71) Applicant: Renesas Electronics Corporation, Kawasaki-shi, Kanagawa (JP)

(72) Inventors: Yasuhiro Okamoto, Kanagawa (JP); Yuji Ando, Kanagawa (JP); Tatsuo Nakayama, Kanagawa (JP); Takashi Inoue, Kanagawa (JP); Kazuki Ota, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/947,172

(22) Filed: Nov. 20, 2015

(65) Prior Publication Data

US 2016/0079409 A1    Mar. 17, 2016

Related U.S. Application Data

(63) Continuation of application No. 14/550,118, filed on Nov. 21, 2014, now Pat. No. 9,231,096, which is a
(Continued)

(30) Foreign Application Priority Data

May 16, 2011  (JP) .................................. 2011-109636

(51) Int. Cl.
*H01L 29/00* (2006.01)
*H01L 29/778* (2006.01)
(Continued)

(52) U.S. Cl.
CPC ......... *H01L 29/7787* (2013.01); *H01L 29/201* (2013.01); *H01L 29/2003* (2013.01);
(Continued)

(58) Field of Classification Search
CPC ........... H01L 29/2003; H01L 29/66462; H01L 29/7783; H01L 29/205
See application file for complete search history.

(56) References Cited

U.S. PATENT DOCUMENTS

| 7,038,253 B2 | 5/2006 | Yoshida et al. |
| 8,344,422 B2 | 1/2013 | Ando et al. |

(Continued)

FOREIGN PATENT DOCUMENTS

| CN | 101971308 A | 2/2011 |
| JP | 2004235473 A | 8/2004 |

(Continued)

OTHER PUBLICATIONS

Communication dated Dec. 15, 2015, issued by the Japan Patent Office in corresponding Japanese Application No. 2015-054319.
(Continued)

*Primary Examiner* — Ngan Ngo
(74) *Attorney, Agent, or Firm* — Sughrue Mion, PLLC

(57) ABSTRACT

A semiconductor device including a field effect transistor including a substrate, a lower barrier layer provided on the substrate, a channel layer provided on the lower barrier layer, an electron supplying layer provided on the channel layer, a source electrode and a drain electrode provided on the electron layer, and a gate electrode provided between the source electrode and the drain electrode. The lower barrier layer includes a composition of $In_{1-z}Al_zN$ ($0 \leq z \leq 1$). The channel layer includes a composition of $Al_xGa_{1-x}N$ ($0 \leq x \leq 1$). A recess is provided in a region between the source electrode and the drain electrode, wherein the recess goes through the
(Continued)

electron supplying layer to a depth that exposes the channel layer, and the gate electrode is disposed on a gate insulating film that covers a bottom surface and an inner wall surface of the recess.

14 Claims, 14 Drawing Sheets

Related U.S. Application Data continuation of application No. 14/117,763, filed as application No. PCT/JP2012/062360 on May 15, 2012, now Pat. No. 8,928,038.

(51) Int. Cl.
    *H01L 29/205*     (2006.01)
    *H01L 29/66*     (2006.01)
    *H01L 29/20*     (2006.01)
    *H01L 29/423*     (2006.01)
    *H01L 29/201*     (2006.01)
    *H01L 29/51*     (2006.01)

(52) U.S. Cl.
    CPC ........ *H01L 29/205* (2013.01); *H01L 29/4236* (2013.01); *H01L 29/66462* (2013.01); *H01L 29/7783* (2013.01); *H01L 29/7786* (2013.01); *H01L 29/517* (2013.01)

(56) References Cited

U.S. PATENT DOCUMENTS

| | | | |
|---|---|---|---|
| 8,928,038 B2* | 1/2015 | Okamoto | ............ H01L 29/2003 |
| | | | 257/192 |
| 9,231,096 B2* | 1/2016 | Okamoto | ............ H01L 29/2003 |
| 2004/0227169 A1 | 11/2004 | Kubo et al. | |
| 2005/0023555 A1 | 2/2005 | Yoshida et al. | |
| 2008/0093626 A1 | 4/2008 | Kuraguchi | |
| 2009/0146185 A1 | 6/2009 | Suh et al. | |
| 2010/0276732 A1 | 11/2010 | Ando et al. | |
| 2011/0006346 A1 | 1/2011 | Ando et al. | |
| 2011/0049527 A1 | 3/2011 | Sato | |
| 2011/0147796 A1* | 6/2011 | Haeberlen | ........... H01L 29/0626 |
| | | | 257/194 |
| 2013/0062612 A1 | 3/2013 | Shioda et al. | |
| 2013/0099245 A1 | 4/2013 | Ando et al. | |

FOREIGN PATENT DOCUMENTS

| | | | |
|---|---|---|---|
| JP | 3977659 | A | 6/2007 |
| JP | 2007258406 | A | 10/2007 |
| JP | 2008103617 | A | 5/2008 |
| JP | 200954807 | A | 3/2009 |
| JP | 2010177416 | A | 8/2010 |
| JP | 201149271 | A | 3/2011 |
| WO | 03071607 | A1 | 8/2003 |
| WO | 2009001888 | A1 | 12/2008 |
| WO | 2009081584 | A1 | 7/2009 |
| WO | 2009113612 | A1 | 9/2009 |
| WO | 2011118099 | A1 | 9/2011 |

OTHER PUBLICATIONS

Communication dated Dec. 15, 2015, from the Intellectual Property Office of Taiwan in counterpart application No. 101116715.
Communication dated Oct. 28, 2014 from The Japanese Patent Office in counterpart Japanese Patent Application No. 2013-515154.
O. Ambacher et al., "Pyroelectric properties of Al(In)GaN/GaN hetero- and quantum well structures", Journal of Physics: Condensed Matter 2002, pp. 3399-3434, vol. 14, Mar. 22, 2002.

* cited by examiner

SEMICONDUCTOR DEVICE AND FIELD EFFECT TRANSISTOR WITH CONTROLLABLE THRESHOLD VOLTAGE

CROSS-REFERENCE TO RELATED APPLICATION

This is a Continuation Application of U.S. application Ser. No. 14/550,118 filed on Nov. 21, 2014, which is a Continuation Application of U.S. application Ser. No. 14/117,763 filed Nov. 14, 2013, which is a National Stage of International Application No. PCT/JP2012/062360 filed May 15, 2012, which claims priority based on Japanese Patent Application No. 2011-109636 filed May 16, 2011, the contents of all of which are incorporated herein by reference in their entirety.

TECHNICAL FIELD

This invention relates to a semiconductor device and, more particularly, to a semiconductor device containing a group III nitride semiconductor as a main component.

BACKGROUND

<Related Technique 1>

Related techniques of a semiconductor device including a group III nitride semiconductor as a principal raw material will be described in the below. FIG. 11 is a diagram illustrating schematically a cross-section of a normally-off type field effect transistor exploiting the group III nitride semiconductor according to Related Technique 1. Such a field effect transistor is disclosed, for example, in Patent Literature 1. In Patent Literature 1, there is disclosed a normally-off type GaN based field effect transistor (FET) of a HEMT (High Electron Mobility Transistor) structure that has a very small on-resistance when operating and that is capable of operating on a large current. It is noted that FIG. 11 is a drawing re-drafted in this application based on FIG. 1 and so on of Patent Literature 1. Referring to FIG. 11, the field effect transistor of the Related Technique 1 has a following arrangement:

A substrate 110 is a sapphire substrate which is a (0001) plane substrate, that is, a C-face substrate;
  a buffer layer 111 is formed of GaN or AlGaN;
  a channel layer 113 is formed of GaN; and
  an electron supplying layer 114 is formed of AlGaN.

On the electron supplying layer 114 that is an upper most semiconductor layer, a source electrode 121 and a drain electrode 122 are disposed to be spaced to each other. Each of the source and drain electrodes 121 and 122 has ohmic contact to the electron supplying layer 114.

A semiconductor surface located between the source electrode 121 and the drain electrode 122 is covered by a SiN protective film 131. The protective film 131 has an opening formed in a part thereon and a groove-shaped recess 141 is formed in a semiconductor portion lying directly underneath the opening in the protective film 131.

There is arranged a gate insulating film 132, formed of $Al_2O_3$, for example, to cover sides and a bottom surface of the recess 141. A gate electrode 123 is arranged on the gate insulating film 132.

In the channel layer 113 on a heterojunction interface between the channel layer 113 and the electron supplying layer 114, there is generated a two-dimensional electron gas (2DEG) 151. However, in a location of a channel layer in which the gate insulating film 132 is arranged in place of the electron supplying layer 114 (recess 141) and the electron supplying layer 114 is not provided, no two-dimensional electron gas is generated. That is, spreading of the two-dimensional electron gas 151 in two-dimensional directions is interrupted at a location where the gate insulating film 132 is arranged. Thus, when the gate is opened, a drain current (drain-to-source current) flowing through the channel layer 113 is suppressed. When a pre-set bias voltage is applied to the gate electrode 123, an inverted population layer of electrons is formed at a location of the channel layer 113 directly underneath the gate insulating film 132. The two-dimensional electron gas, which was interrupted before applying the gate voltage, is connected via the inverted population layer, thus exhibiting an operation (FET operation) of a field effect transistor (a normally-off type FET).

FIG. 12 is a diagram illustrating an energy-band underneath a gate in an equilibrium state of the semiconductor device illustrated in FIG. 11. When a positive voltage is applied to the gate electrode, there occurs a state in which the Fermi level of the semiconductor is higher than a conduction band, so that electrons are accumulated in an interface between an insulation film and the semiconductor. A gate voltage, in which such a state is produced, is termed a 'threshold voltage', which is one of crucial indices of a field effect transistor.

In particular, in the case where a normally off transistor is used as a switching device for power control, a threshold voltage greater than or equal to +3V is required in order to secure safety which takes account of noise immunity.

Patent Literature 1: International Laid-Open Gazette of 2003/071607 (WO2003/071607)
Patent Literature 2: International Laid-Open Gazette of 2009/081584 (WO2009/081584)
Non-Patent Literature 1: Journal of Physics, vol. 14, pp. 3399 to 3434, 2002

SUMMARY

The following gives an analysis formed of the Related Techniques.

As will be understood from the operation of the field effect transistor of the Related Technique 1, described above with reference to FIG. 11 and FIG. 12, the threshold voltage is closely associated with a difference between a conduction band and the Fermi level at an insulation film-semiconductor interface in an equilibrium state. This difference is indicated as $\Delta VMS$ in FIG. 12.

In the field effect transistor of the Related Technique 1, this $\Delta VMS$ is determined by a difference between a work function $\Phi M$ of the gate electrode (gate metal) and electron affinity of the semiconductor $\chi S$ (That is, $\Delta VMS = \Phi M - \chi S$).

In other words, in the field effect transistor of the structure of the Related Technique 1, described with reference mainly to FIG. 11, there is only little room for designing a threshold voltage through changing of device structure parameters.

For example, although it is possible to change the threshold voltage by selection of a gate electrode material, a range of such change is around 1V at most. On the other hand, in a semiconductor device fabrication, it may not be said to be realistic to change an electrode material for the sake of designing a threshold voltage of a field effect transistor.

FIG. 13 is a graph illustrating the results of computing relationship between a gate voltage and a concentration of the two-dimensional electron gas accumulated in an insulation film-semiconductor interface (electron concentration× thickness) for various thicknesses of the gate insulating film of a field effect transistor having a structure of the Related Technique 1. The gate voltage (V) is plotted on an abscissa and a two-dimensional electron gas concentration (Ns (cm$^{-2}$)) is plotted on an ordinate. The graph indicates results of analyses conducted by the present inventors.

The results of FIG. 13 show that, even when the thickness of the gate insulating film (132 of FIG. 11, for example) is changed in a range from 5 nm to 15 nm through 10 nm, the electron concentration commences to increase from the same value of the gate voltage, indicating that the threshold voltage is not at all changed. In addition, the threshold voltage calculated is on the order of 1V, which appreciably differs from +3V required in practical applications.

That is, the field effect transistor of the Related Technique 1 suffers from the defects that not only a high enough threshold voltage may not be achieved, but also there is scarcely any room for threshold voltage designing.

<Related Technique 2: Technique to Enlarge a Threshold Voltage Designing Range>

A field effect transistor, in which it is possible to enlarge a range of threshold voltage designing, is disclosed in Patent Literature 2, for example, as the Related Technique 2. FIG. 14 is a diagram in which FIG. 1 and so on of Patent Literature 2 is re-drawn (as for details, reference is to be made to the description of Patent Literature 2). Referring to FIG. 14, this field effect transistor has the following structure:

A substrate 110 is a (0001) plane silicon carbide (SiC) substrate;

a buffer layer 111 is formed of AlGaN;

a lower barrier layer 112 is formed of lattice-relaxed $Al_xGa_{1-x}N$ (0≤x≤1); and a channel layer 113 is formed of $In_yGa_{1-y}N$ (0≤y≤1) that has a band gap narrower than that of the lower barrier layer 112 and that has a compressive strain.

On the GaN channel layer 113 which is the upper most semiconductor layer, a source electrode 121 and a drain electrode 122 are disposed spaced apart from each other, and are contacted with ohmic contact to the channel layer 113. A semiconductor surface part between the source electrode 121 and the drain electrode 122 is covered with a gate insulating film 132, on which a gate electrode 123 is arranged. The gate insulating film 132 is polycrystalline or amorphous and, in the exemplary embodiment of the Patent Literature 2, is formed of silicon nitride ($Si_3N_4$).

The GaN channel layer 113 is compressive strained and hence generated a piezoelectric polarization, such that there is produced a two-dimensional electron gas layer 151 in an interface to the lower barrier layer 112.

The buffer layer 111 is an undoped AlGaN layer with a graded composition. Specifically, the Al composition ratio in the buffer layer 111 is progressively decreased, for example, from 1 to 0.1 along a direction from the substrate 110 towards the lower barrier layer 112. In this case, an Al composition ratio x=0.1 at the lower barrier layer 112 of $Al_xGa_{1-x}N$, and an N type impurity, such as silicon Si, is doped. The buffer layer 111 operates to release an accumulation of a distortion energy due to lattice mismatch or the like, by dislocation (more specifically by misfit dislocation which takes place on an interface or the like). A lattice constant on the upper most surface of the buffer layer is made matched to that of the AlGaN lower barrier layer 112 (lattice matching). The AlGaN buffer layer 111 is a buffer layer to set the AlGaN lower barrier layer 112 to a lattice-relaxed state (that is, an unstrained state). To mitigate an effect of the dislocation, a thickness of the AlGaN buffer layer 111 is set to a value greater than or equal to 0.1 μm and less than or equal to 10 μm. For lattice matching to the upper most surface of the buffer layer 111, the AlGaN lower barrier layer 112 is unstrained, that is, lattice-relaxed. In an Example of Patent Literature 2, the channel layer 113 is an undoped GaN layer which is made thinner in thickness than a critical film thickness where dislocation occurs, and is a stained lattice layer.

In the field effect transistor of the Related Technique 2, shown in FIG. 14, a concentration of n-type impurities doped to the AlGaN lower barrier layer 112 is controlled to change the two-dimensional electron gas layer 151 to allow for designing the threshold voltage over a broader range.

However, in the Related Technique 2, a layer having a compressive strain is used as the channel layer 113. For this reason, a piezoelectric polarization occurs in a direction to cancel out a spontaneous polarization, so that, due to the reverse piezo effect (in which mechanical strain is produced by voltage application), the drain current characteristic when a lattice defect occurs may be severely affected. Hence, the Related Technique 2 leaves much to be improved in connection with long-span reliability.

The present invention provides a configuration as outlined in the following (It is noted that the configuration is given merely by way of illustration, that is, not in a restrictive sense).

According to one of the embodiments, there is provided a field effect transistor comprising: a substrate; and a semiconductor layer provided on the substrate, the semiconductor layer including:

a lower barrier layer provided on the substrate, Ga-face grown and lattice-relaxed, the lower barrier layer having a composition of $In_{1-z}Al_zN$ (0≤z≤1); and a channel layer provided on the lower barrier layer and lattice-matched to the lower barrier layer, the channel layer having a composition of: $Al_xGa_{1-x}N$ (0≤x≤1) or $In_yGa_{1-y}N$ (0≤y≤1), or GaN;

a source electrode and a drain electrode disposed spaced to each other, the source electrode and the drain electrode each having an ohmic contact to an upper part of the semiconductor layer; and a gate electrode arranged via a gate insulating film in a region lying between the source electrode and the drain electrode.

According to one of the embodiments, a threshold voltage of a field effect transistor is able to be controlled by changing a thickness of the gate insulating film, thus contributing to increasing a value of the threshold voltage as well as to enlarging a threshold voltage design range. Moreover, according to one of the embodiments, a channel layer is lattice-matched to a lower barrier layer, and hence there is not a strain included in the channel layer, thereby leading to high reliability.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

MODES

Figure 1:
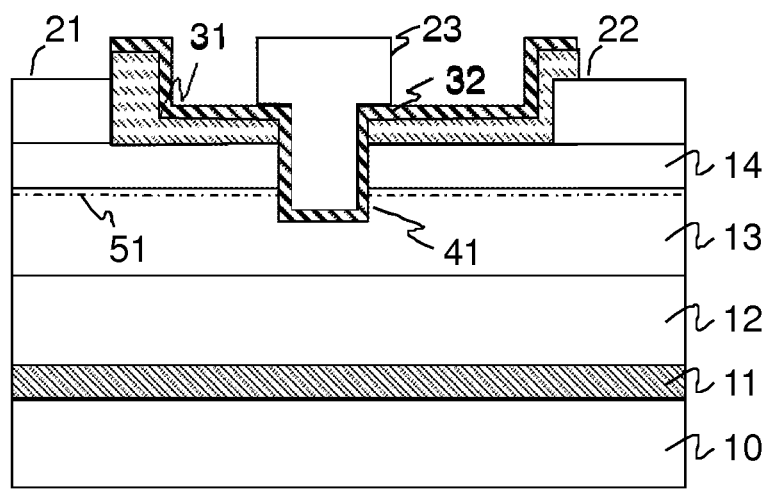
FIG. 1 is a schematic cross-sectional view illustrating a field effect transistor according to a first exemplary embodiment.

Preferred modes for carrying out the present invention will now be described. According to several preferred modes, there is provided a normally off type group III nitride based field effect transistor that provides a high threshold voltage designing performance. According to the preferred modes, the field effect transistor comprises: a substrate (10) and a semiconductor layer provided on the substrate (10). The semiconductor layer includes: a Ga-face grown buffer layer (11) provided on the substrate (10) and including GaN or AlGaN; a lower barrier layer (12) having a composition of $In_{1-z}Al_zN$ ($0 \leq z \leq 1$) that is lattice-relaxed, and a channel layer (13) that has a composition of $Al_xGa_{1-x}N$ ($0 \leq x \leq 1$) or $In_yGa_{1-y}N$ ($0 \leq y \leq 1$) and that is provided on and lattice-matched to the lower barrier layer (12) (a lattice constant is the same as that of the lower barrier layer). A source electrode (21) and a drain electrode (22) are disposed spaced to each other and contacted with an ohmic contact to an upper part of the semiconductor layer. A gate electrode (23) is arranged via a gate insulating film (32) in a region between the source electrode (21) and the drain electrode (22).

In a preferred mode, negative interface charges are generated on an interface between the lower barrier layer $In_{1-z}Al_zN$ and the channel layer $Al_xGa_{1-x}N$ or $In_yGa_{1-y}N$ ascribable to a polarization effect. Thus, a negative electric field E is generated in the gate insulating film, in an equilibrium state, with the electric field E being directed approximately along the direction normal to the gate insulating film proceeding from the channel layer towards the gate electrode. With the thickness of the gate insulating film being d, a voltage V=E×d is generated in conductors (electrodes) with the gate insulating film therebetween. The value of V=E×d may be changed by changing the thickness d of the gate insulating film. It is thus possible to control the threshold voltage of the field effect transistor. By applying a positive voltage corresponding to the threshold voltage (Vth0 which is around 1V in the case of FIG. 13) plus the voltage V=E×d, that is, Vth0+E×d, or a higher voltage, to the gate electrode, a two-dimensional electron gas is generated, so that the drain current begins to flow. Thus, the preferred mode contributes appreciably to increasing the threshold voltage as well as to enhancing the threshold voltage design range of the field effect transistor.

In a preferred mode, the composition of the channel layer of the field effect transistor is $Al_xGa_{1-x}N$ ($0 \leq x \leq 1$) and the value of the composition ratio z of the composition of $In_{1-z}Al_zN$ of the lower barrier layer thereof is $0.76 \leq z \leq 1$.

Or, in a preferred mode, the composition of the channel layer is $In_yGa_{1-y}N$ ($0 \leq y \leq 1$) and that of the lower barrier layer is $In_{1-z}Al_zN$ ($0 \leq z \leq 0.86$).

In a further preferred mode, the channel layer is lattice-matched to the lower barrier layer so that there is no strain included in the channel layer, thereby leading to high reliability. The present invention will be described in more detail with reference to preferred exemplary embodiments.

First Exemplary Embodiment

FIG. 1 is a diagram schematically illustrating a cross-sectional configuration of a field effect transistor according to a first exemplary embodiment of the present invention. The field effect transistor, shown in FIG. 1, has the following configuration:

A substrate 10 is a sapphire substrate which is a (0001) plane, that is, a C-plane, substrate;

a buffer layer 11 is formed of GaN or AlGaN;

a lower barrier layer 12 is formed of lattice-relaxed InAlN;

a channel layer 13 is formed of $Al_xGa_{1-x}N$ ($0 \leq x \leq 1$) or $In_yGa_{1-y}N$ ($0 \leq y \leq 1$), lattice-matched to the lower barrier layer 12; and an electron supplying layer 14 is formed of AlGaN.

On the electron supplying layer 14, which is an upper most semiconductor layer, a source electrode 21 and a drain electrode 22 are disposed spaced to each other, and are contacted with ohmic contact to the electron supplying layer 14. A semiconductor surface part between the source electrode 21 and the drain electrode 22 is covered by a SiN protective film 31. The protective film 31 has an opening in a part thereof and there is provided a groove-shaped recess 41 formed in a semiconductor portion lying directly underneath the opened part of the protective film. A gate insulating film 32, formed of $Al_2O_3$, as an example, is provided to cover the sides and a bottom surface of the recess 41. A gate electrode 23 is provided on the gate insulating film 32.

The buffer layer 11 brings about a lattice-relaxed state (unstrained) of the InAlN lower barrier layer 12. The InAlN lower barrier layer 12 is in an unstrained state, that is, in a lattice-relaxed state, in order that it will be lattice-matched to the upper most surface of the buffer layer 11.

Figure 2A:
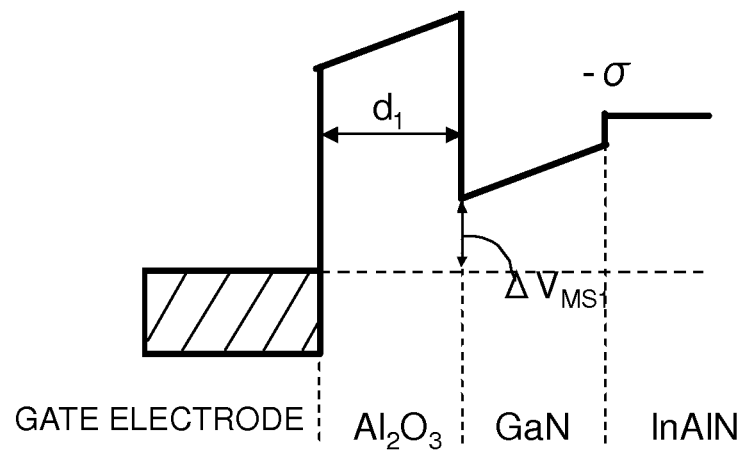
FIG. 2A and FIG. 2B are diagrams schematically illustrating an energy band of the field effect transistor according to the first exemplary embodiment.

FIG. 2A is an energy-band diagram underneath the gate in the state of equilibrium of the field effect transistor of FIG. 1. Since surface charges of a negative polarity are generated on an interface between the InAlN lower barrier layer 12 and a GaN channel layer 13, an electric field of a negative polarity is generated in the GaN channel layer 13 and in the $Al_2O_3$ gate insulating film 32.

For this reason, ΔVMS may be increased as compared with the Related Technique 1 (FIG. 12) where no electric field is generated in the gate insulating film, thus achieving a high threshold voltage.

Figure 2B:
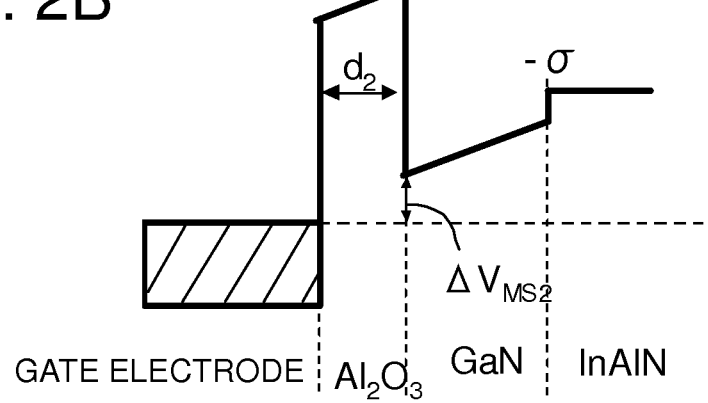

On the other hand, ΔVMS may be changed by changing the thickness d of the gate insulating film 32 ($Al_2O_3$), as shown in FIG. 2B (in FIG. 2A, the gate insulating film 32 ($Al_2O_3$) has a thickness d1, with ΔVMS being ΔVMS1; in FIG. 2B, the gate insulating film 32 ($Al_2O_3$) has a thickness d2, with ΔVMS being ΔVMS2). The threshold voltage may thus be designed by changing a device structure parameter (film thickness of the gate insulating film).

Figure 3:
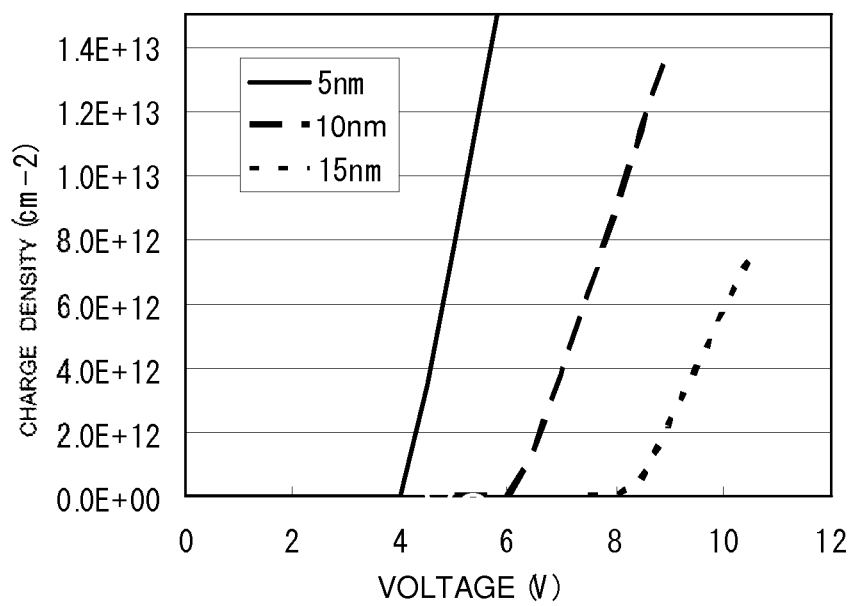
FIG. 3 is a graph illustrating a relationship between gate voltage and charge density accumulated in the field effect transistor according to the first exemplary embodiment.
Figure 13:
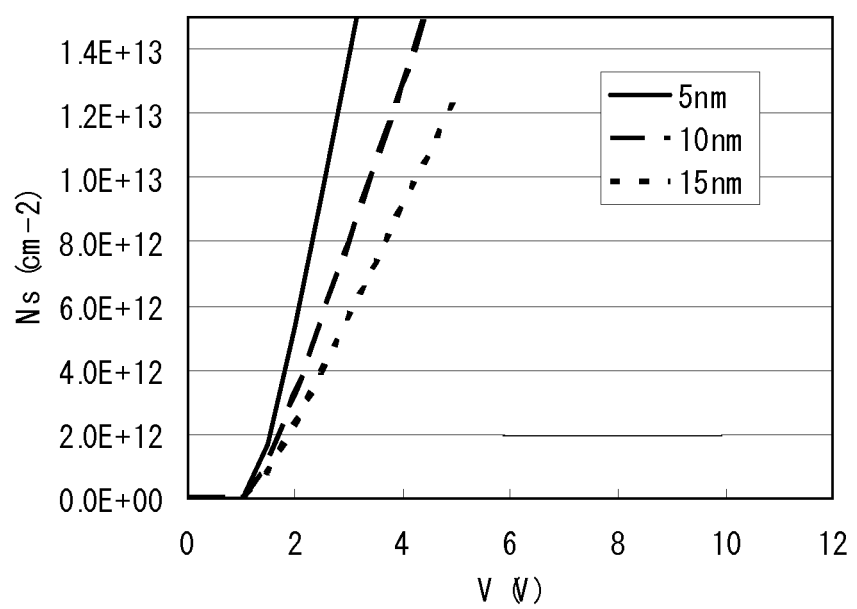
FIG. 13 is a graph illustrating a relationship between gate voltage and charge density accumulated in the field effect transistor according to the Related Technique 1.
Figure 14:
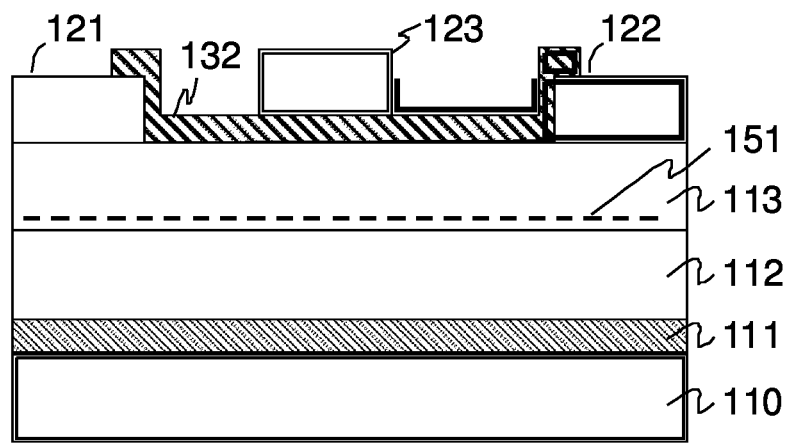
FIG. 14 is a schematic cross-sectional view illustrating a field effect transistor according to the Related Technique 2.

FIG. 3 shows, for variable values of the thickness d of the gate insulating film in the field effect transistor of FIG. 1, results of computing the relationship between a gate voltage and a concentration of electrons accumulated on the insulation film–a semiconductor interface. The concentration of electrons is a concentration of two-dimensional electric charges, that is, the electron concentration×thickness in a unit of $cm^{-2}$. In the structure of the Related Technique 1, the threshold voltage is on the order of 1V, as shown in FIG. 13, whereas, in the structure of the present exemplary embodiment, the threshold voltage is +4V or higher, indicating that a high enough threshold voltage may be achieved. With the thicknesses of the gate insulating film being changed to 5 nm, 10 nm and 15 nm, the threshold voltage is changed significantly to 4V, 6V and 8V, respectively. Thus, the threshold voltage design range is expanded.

In the above, as the channel layer 13, GaN, only as an example. The channel layer 13 may also be AlGaN or InGaN, provided that it is possible to generate negative charges on an interface between it and the lower barrier layer 12.

In the present exemplary embodiment, to assure high reliability, the lower barrier layer 12 and the channel layer 13 preferably represent a lattice-matched system. However, fluctuations on the order of 0.05 in terms of a composition ratio may be tolerable.

In the field effect transistor of FIG. 1, surface charges and the threshold voltage may be designed as follows:

According to Non-Patent Literature 1, lattice constants and spontaneous polarizations $P_{sp}$ of InAlN, InGaN and AlGaN, may be expressed as follows:

$$a(Al_xGa_{1-x}N)=3.1986-0.0891x \quad (1)$$

$$a(In_yGa_{1-y}N)=3.1986+0.3862y \quad (2)$$

$$a(In_{1-z}Al_zN)=3.5848-0.4735z \quad (3)$$

$$P_{sp}(Al_xGa_{1-x}N)=-0.090x-0.031(1-x)+0.021x(1-x) \text{ Cm}^{-2} \quad (4)$$

$$P_{sp}(In_yGa_{1-y}N)=-0.042y-0.034(1-y)+0.037y(1-y) \text{ Cm}^{-2} \quad (5)$$

$$P_{sp}(In_{1-z}Al_zN)=-0.090z-0.042(1-z)+0.070z(1-z) \text{ Cm}^{-2} \quad (6)$$

where a unit of the spontaneous polarization is C (Coulomb) $m^{-2}$.

When there is a strain ∈ in the buffer layer 11, the piezoelectric polarization of AlN is given by the following equations (7) and (8) and the piezoelectric polarization of GaN and InN is given by the following equations (9) and (10).

$$P_{pz}(AlN)=-1.808\epsilon+5.624\epsilon^2 \text{ Cm}^{-2} \text{ for } \epsilon<0 \quad (7)$$

$$P_{pz}(AlN)=-1.808\epsilon-7.888\epsilon^2 \text{ Cm}^{-2} \text{ for } \epsilon>0 \quad (8)$$

$$P_{pz}(GaN)=-0.918\epsilon+9.541\epsilon^2 \text{ Cm}^{-2} \quad (9)$$

$$P_{pz}(InN)=-1.373\epsilon+7.559\epsilon^2 \text{ Cm}^{-2} \quad (10)$$

In the above equations (7) to (10), with the lattice constant of the buffer layer 11 being denoted as $a_{buffer}$ and that of the lower barrier layer 12 by $a_{es}$, the strain ∈ is given by the following equation (11):

$$\epsilon=(a_{buffer}-a_{es})/a_{es} \quad (11)$$

The piezoelectric polarization of $Al_xGa_{1-x}N$ and $In_yGa_{1-y}N$, each having a strain ∈ with respect to the buffer layer 11, may be represented by the following equations (12) and (13):

$$P_{pz}(Al_xGa_{1-x}N)=xP_{pz}(AlN)+(1-x)P_{pz}(GaN) \quad (12)$$

$$P_{pz}(In_yGa_{1-y}N)=yP_{pz}(InN)+(1-y)P_{pz}(GaN) \quad (13)$$

Thus, from the equations (7), (8), (9) and (10), $$P_{pz}(Al_xGa_{1-x}N) = \\ x(-1.808\varepsilon + 5.624\varepsilon^2) + (1-x)(-0.918\varepsilon + 9.541\varepsilon^2) \text{ for } \varepsilon < 0 \quad (14)$$

$$P_{pz}(Al_xGa_{1-x}N) = \\ x(-1.808\varepsilon - 7.888\varepsilon^2) + (1-x)(-0.918\varepsilon + 9.541\varepsilon^2) \text{ for } \varepsilon > 0 \quad (15)$$

$$P_{pz}(In_yGa_{1-y}N) = \\ y(-1.373\varepsilon + 7.559\varepsilon^2) + (1-y)(-0.918\varepsilon + 9.541\varepsilon^2) \quad (16)$$

In this system, in the case wherein the channel layer 13 is $Al_xG_{1-x}N$ and the lower barrier layer 12 is $In_{1-z}Al_zN$, the spontaneous polarization $P_{sp}$ is given, from the equations (4) and (6), by the following equation (17), in which the spontaneous polarization $P_{sp}(In_{1-z}Al_zN)$ of the $In_{1-z}Al_zN$ lower barrier layer is subtracted from the spontaneous polarization $P_{sp}(Al_xG_{1-x}N)$ in the $Al_xG_{1-x}N$ channel layer.

$$P_{sp}(Al_xGa_{1-x})N/In_{1-z}Al_zN = P_{sp}(Al_xGa_{1-x}N) - P_{sp}(In_{1-z}Al_zN) = \\ \{-0.090x - 0.031(1-x) + 0.021x(1-z)\} - \\ \{-0.090x - 0.0242(1-z) + 0.070z(1-z)\} \quad (17)$$

An charge density σ, generated on an interface between the channel layer 13 of $Al_xGa_{1-x}N$ and the lower barrier layer 12 of $In_{1-z}Al_zN$, is given by the following equation (18):

$$\sigma(Al_xGa_{1-x}N/In_{1-z}Al_zN)=P_{sp}(Al_xGa_{1-x}N/In_{1-z}Al_zN)+ \\ P_{pz}(Al_xGa_{1-x}N) \quad (18)$$

Figure 4:
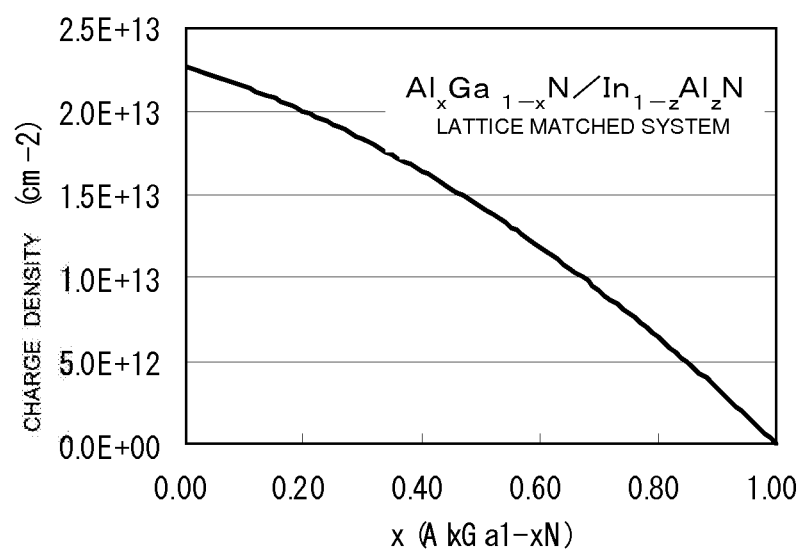
FIG. 4 is a graph illustrating a relationship between Al composition ratio in AlGaN and charge density accumulated.

FIG. 4 shows, for the case of using the $Al_xGa_{1-x}N$ channel layer, lattice-matched to the lower barrier layer, the relationship between the Al composition ratio x of $Al_xGa_{1-x}N$ and the charge density (surface density) on an interface between the $Al_xGa_{1-x}N$ channel layer and the $In_{1-z}Al_zN$ lower barrier layer, wherein an abscissa indicates the Al composition ratio x and an ordinate indicate the surface density. It is noted that the surface density, plotted on the ordinate (in a unit of $cm^{-2}$) is an absolute value of σ/q, where σ is a charge density (surface density) and q is an elementary charge of $1.602\times10^{-19}$ C. On an interface between the $Al_xGa_{1-x}N$ channel layer 13 and the $In_{1-z}Al_zN$ lower barrier layer 12, there are generated in a unit area electric charges equal to the charge density (surface density) of FIG. 4 multiplied by the elementary charge q, with a sign of the electric charges generated being negative (minus).

It is noted that the computation results shown in FIG. 3 represent the charge density for the case of x=0 in the equation (18) (charge density produced on an interface between the GaN channel layer 13 and the $In_{1-z}Al_zN$ lower barrier layer 12).

Figure 5:
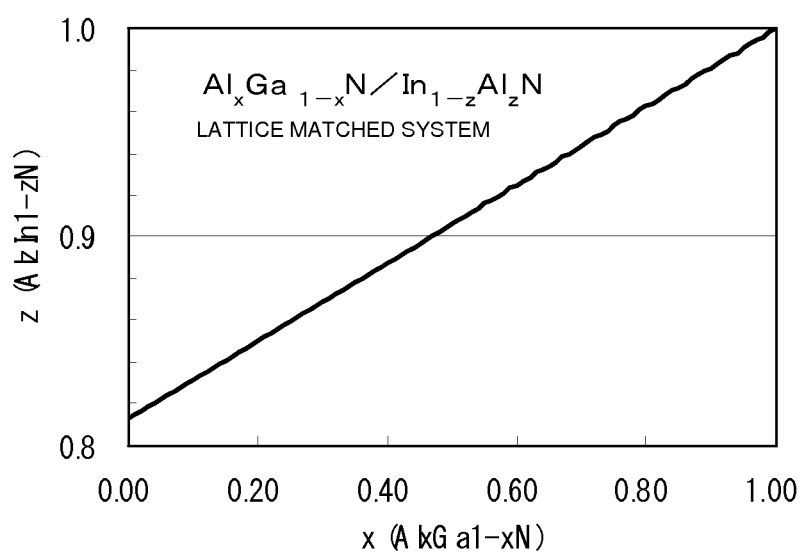
FIG. 5 is a graph illustrating a relationship between compositions of AlGaN and InAlN lattice-matched to each other.

The combinations of the lattice-matched compositions may be decided from the equations (1) and (3). FIG. 5 shows the relationship between the Al composition ratio x of the composition $Al_xGa_{1-x}N$ (an abscissa) and the Al composition ratio z of the composition $In_{1-z}Al_zN$ (an ordinate). The two compositions are lattice-matched to each other. It is seen from FIG. 5 that lattice match to $Al_xGa_{1-x}N$ may be realized for values of z such that $0.81 \leq z \leq 1$. However, in consideration of possible fluctuations at the time of crystal growth, the value of z such that $0.76 \leq z \leq 1$ may be expected to produce comparable results.

It is assumed that surface charges (negative charges) having the charge density as shown by the equation (18) are present on the interface between the $Al_xGa_{1-x}N$ channel layer 13 and the $In_{1-z}Al_zN$ lower barrier layer 12. In this case, an electric field $E_{ins}$ applied to the gate insulating film 32 in an equilibrium state is given by the following equation (19):

$$E_{ins}(Al_xGa_{1-x}N/In_{1-z}Al_zN) = \sigma(Al_xGa_{1-x}N/In_{1-z}Al_zN)/(\in_r \in_0) \quad (19)$$

where $\in_r$ is a relative dielectric constant of the gate insulating film and $\in_0$ is a dielectric constant of vacuum.

$E_{ins}(Al_xGa_{1-x}N/In_{1-z}Al_zN)$ of the equation (19) represents the strength of an electric field applied to the gate insulating film 32 along a direction normal to the gate insulating film 32, by electric charges (negative electric charges) $\sigma(Al_xGa_{1-x}N/In_{1-z}Al_zN)$ present on the interface between the $Al_xGa_{1-x}N$ channel layer and the $In_{1-z}Al_zN$ lower barrier layer. Regarding the equation (19), the gate insulating film 32 may be regarded to be a dielectric film with a relative dielectric constant $\in_r$, while the channel layer 13 and the gate electrode 23 facing each other with the gate insulating film 32 in-between may be regarded as a parallel plate capacitor with the channel layer 13 and the gate electrode 23 being parallel plate electrodes (wherein the parallel plate electrodes are each of an area S and are spaced apart from each other by a distance $d_{ins}$). With the electric charges on the parallel plate electrodes of +Q and −Q, the electric field $E_{ins}$ (directed along a direction from the +Q electrode to the −Q electrode) may be expressed by $$E_{ins} \times S = Q/(\in_r \in_0).$$

From $Q/S = \sigma$, the following is derived.

$$E_{ins} = \sigma/(\in_r \in_0).$$

Figure 11:
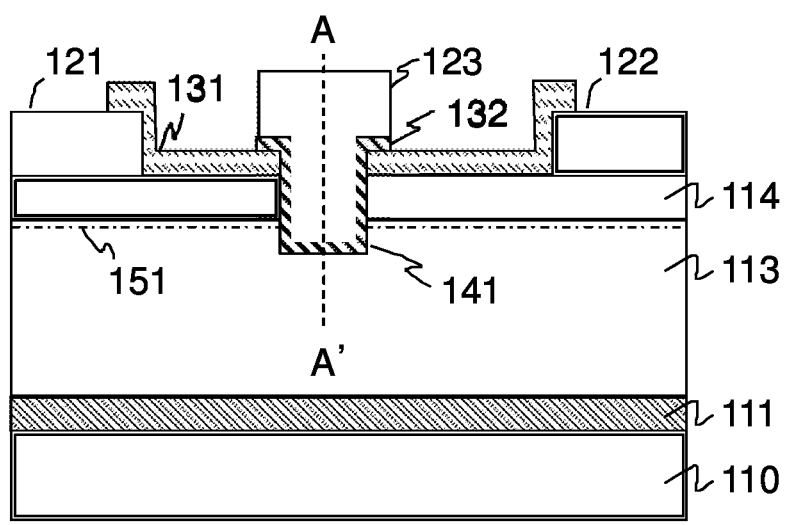
FIG. 11 is a schematic cross-sectional view illustrating a field effect transistor according to the Related Technique 1.
Figure 12:
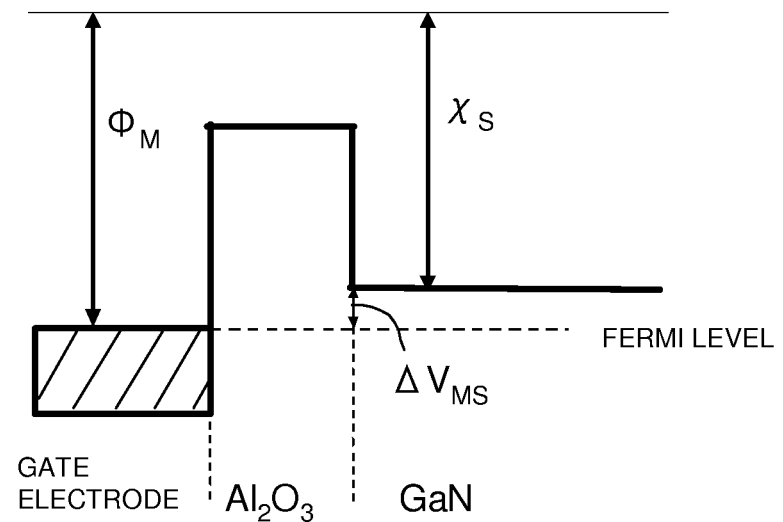
FIG. 12 is a diagram illustrating an energy band of the field effect transistor according to the Related Technique 1.

It is assumed that a threshold voltage for a structure in which no electric field is applied in the equilibrium state to the gate insulating film, that is, for a structure shown in the Related Technique 1 and in FIG. 11, FIG. 12 hereof, is expressed as $V_{th0}$. Then, a threshold voltage $V_{th}$ for such a case where the electric field $E_{ins}$ of the equation (19) is applied to the gate insulating film may be represented by the following equation (20):

$$V_{th}(Al_xGa_{1-x}N/In_{1-z}Al_zN) = E_{ins}(Al_xGa_{1-x}N/In_{1-z}Al_zN) \times d_{ins} + V_{th0} \quad (20)$$

In the equation (20), $d_{ins}$ is the thickness of the gate insulating film.

$V_{th}(Al_xGa_{1-x}N/In_{1-z}Al_zN)$ in the above equation (20) represents the threshold voltage when the electric field $E_{ins}(Al_xGa_{1-x}N/In_{1-z}Al_zN)$ is applied to the gate insulating film 32 by the electric charge $\sigma(Al_xGa_{1-x}N/In_{1-z}Al_zN)$ present on the interface between the $Al_xGa_{1-x}N$ channel layer and the $In_{1-z}Al_zN$ lower barrier layer.

It is noted that $E_{ins} \times d_{ins}$ in the equation (20) corresponds to a potential difference $V = E_{ins} \times d_{ins}$ between the electrodes of the parallel plate capacitor model (with the distance $d_{ins}$ and with the electric field $E_{ins}$) and in FIG. 1, corresponds to that a potential on the channel layer 13 side of the gate insulating film 32 is lower by $V = E_{ins} \times d_{ins}$ than a potential at the gate electrode 23.

Figure 6:
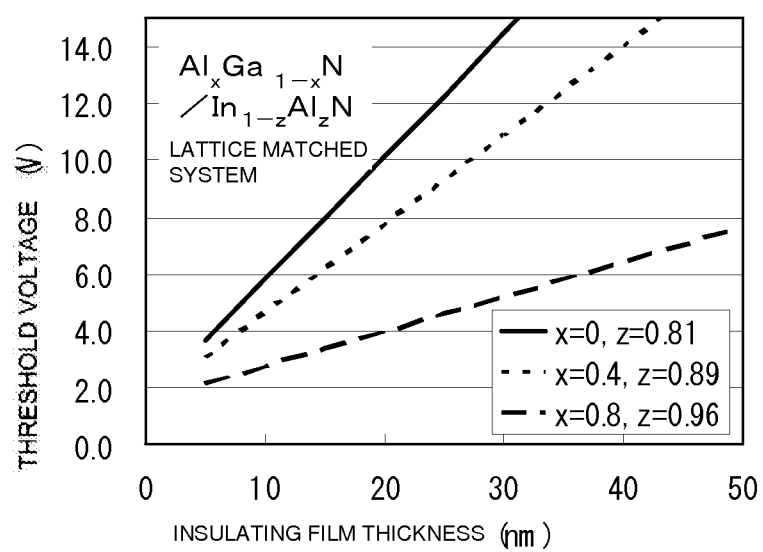
FIG. 6 is a graph illustrating the relationship between film thickness of a gate insulating film and threshold voltage.

The relationship between the threshold voltage and the gate insulating film in the $Al_xGa_{1-x}N/In_{1-z}Al_zN$ lattice-matched system is shown in FIG. 6, in which an abscissa indicate the film thickness (nm) of the gate insulating film and an ordinate indicates the threshold voltage. The results for (x, z) = (0, 0.81), (0.4, 0.89) and (0.8, 0.96), where x denotes a composition ratio of Al in $Al_xGa_{1-x}N$ and z a composition ratio of Al in $In_{1-z}Al_zN$, are shown. In each of the cases, the threshold voltage is increased approximately in direct proportion to increase in the film thickness (nm) of the gate insulating film. Thus, the equation (20) is confirmed.

Next, the interface charges, originating from the spontaneous polarization for the case of the channel layer being of $In_yGa_{1-y}N$, may be given, from the equations (5) and (6), by the following equation (21):

$$P_{sp}(In_yGa_{1-y}N/In_{1-z}Al_zN) = P_{sp}(In_yGa_{1-y}N) - P_{sp}(In_{1-z}Al_zN) = \quad (21)$$
$$\{-0.042y - 0.034(1-y) + 0.037y(1-y)\} -$$
$$\{-0.090z - 0.042(1-z) + 0.070z(1-z)\}$$

Hence, the charge density $\sigma$, generated on the interface between the $In_yGa_{1-y}N$ channel layer 13 and the $In_{1-z}Al_zN$ lower barrier layer 12, is given by the following equation (22):

$$\sigma(In_yGa_{1-y}N/In_{1-z}Al_zN) = P_{sp}(In_yGa_{1-y}N/In_{1-z}Al_zN) + P_{pz}(In_yGa_{1-y}N) \quad (22)$$

Figure 7:
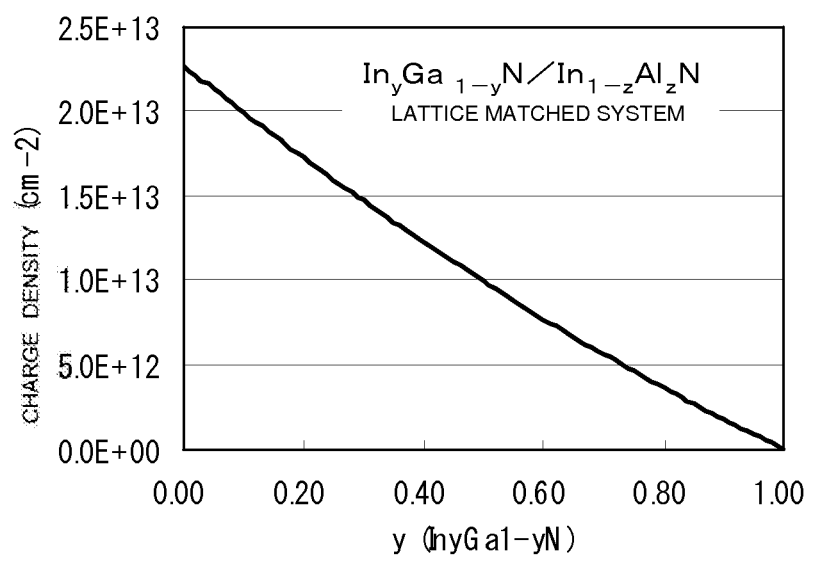
FIG. 7 is a graph illustrating a relationship between In composition ratio of InGaN and charge density accumulated.

The relationship between the InGaN composition and the charge density $\sigma$ in the case where the lattice-matched $In_yGa_{1-y}N$ channel layer 13 is used in FIG. 1, is shown in FIG. 7. In FIG. 7, an abscissa indicates an In composition ratio y and an ordinate indicates the charge density (charge surface density) in $cm^{-2}$ in an absolute value of $\sigma/q$, which is an absolute value of the charge density $\sigma$ of the equation (22) divided by an elementary charge q ($=1.602 \times 10^{-19}$ C).

Figure 8:
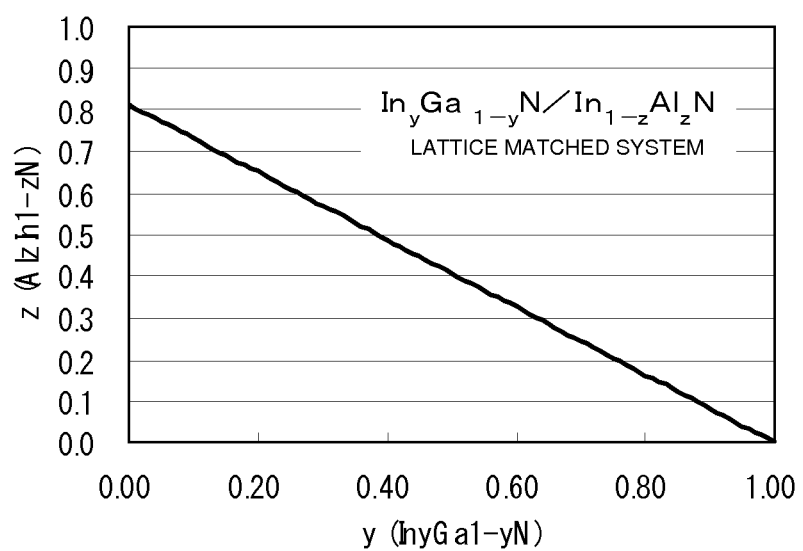
FIG. 8 is a graph illustrating a relationship between compositions of InGaN and InAlN lattice-matched to each other.

The combinations of the $In_yGa_{1-y}N$ channel layer 13 and the $In_{1-z}Al_zN$ lower barrier layer, lattice-matched to each other, are able to be decided from the equations (2) and (3). FIG. 8 shows the relationship between y of $In_yGa_{1-y}N$ and z in $In_{1-z}Al_zN$ lattice-matched. More specifically, an abscissa of FIG. 8 indicates an In composition ratio y of $In_yGa_{1-y}N$, and an ordinate indicates an Al composition ratio z of the $Al_zIn_{1-z}N$. The Al composition ratio z for lattice matching to $In_yGa_{1-y}N$ is in the range of $0 \leq z \leq 0.81$. However, in consideration of possible fluctuations in the process of crystal growth, the value of z in a range of $0 \leq z \leq 0.86$ may be expected to produce comparable results.

In the same manner as with the equation (19), the electric field $E_{ins}$, applied in an equilibrium state to the gate insulating film 32, is given by the following equation (23):

$$E_{ins}(In_yGa_{1-y}N/In_{1-z}Al_zN) = \sigma(In_yGa_{1-y}N/In_{1-z}Al_zN)/(\in_r \in_0) \quad (23)$$

In the same manner as with the equation (20), the threshold voltage may be given by the following equation (24):

$$V_{th}(\text{In}_y\text{Ga}_{1-y}\text{N}/\text{In}_{1-z}\text{Al}_z\text{N}) = \frac{E_{ins}(\text{In}_y\text{Ga}_{1-y}\text{N}/\text{In}_{1-z}\text{Al}_z\text{N})}{d_{ins} + V_{tho}} \quad (24)$$

In the equation (24), $V_{tho}$ is a threshold voltage for such a structure in which no electric field is applied to the gate insulating film in an equilibrium state, that is, for an arrangement such as is shown as the Related Technique 1.

Figure 9:
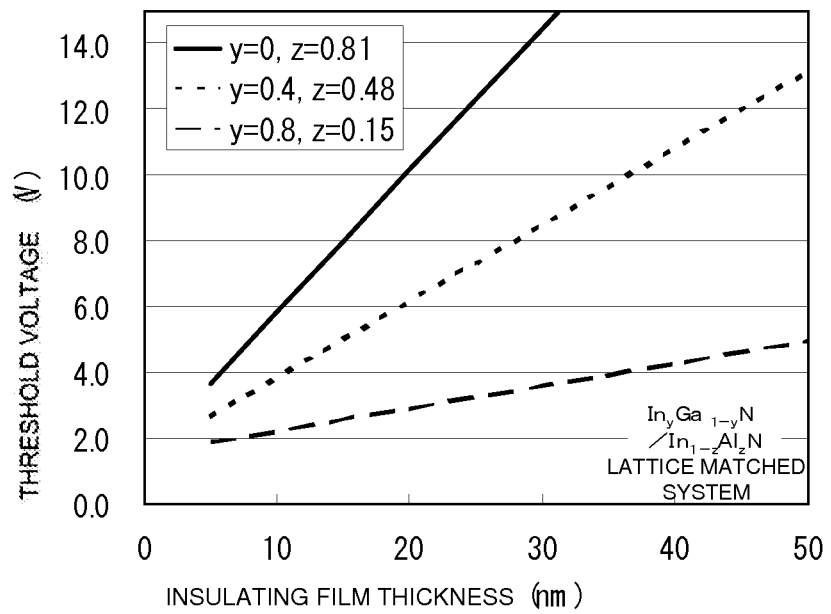
FIG. 9 is a graph illustrating a relationship between gate insulating film and threshold voltage.

FIG. 9 is a diagram showing for an $\text{In}_y\text{Ga}_{1-y}\text{N}/\text{In}_{1-z}\text{Al}_z\text{N}$ lattice-matched system, with $\text{In}_y\text{Ga}_{1-y}\text{N}$ representing a channel layer, a relationship between the film thickness of the gate insulating film 32 (abscissa) and the threshold voltage (ordinate). An abscissa indicates the film thickness of the gate insulating film in nm and an ordinate indicates the threshold voltage V. The results for (y, z)=(0, 0.81), (0.4, 0.48) and (0.8, 0.15), where y denotes a composition ratio of In in $\text{In}_y\text{Ga}_{1-y}\text{N}$ and z a composition ratio of Al in $\text{In}_{1-z}\text{Al}_z\text{N}$, are shown. In each case, the threshold voltage is increased approximately in direct proportion to increase in the film thickness (nm) of the gate insulating film. Thus, the equation (24) is confirmed.

In the foregoing, composition designing of a semiconductor material based on the information disclosed in Non-Patent Literature 1 has been discussed. If, as a result of future investigations, the above mentioned equations should be obtained with higher accuracy, composition designing may be performed based on new information obtained by such investigations.

To secure high reliability, the lower barrier layer in the present exemplary embodiment is preferably lattice-matched to the channel layer. However, should there be fluctuations on the order of 0.05 in terms of the composition ratio(s), ascribable to possible non-accuracy in the crystal growth, quasi-equivalent results may still be obtained.

The above mentioned field effect transistor may be fabricated as follows:

A buffer layer 11 (film thickness: 1 μm), a lower barrier layer 12 formed of lattice-relaxed InAlN (film thickness: 1 μm), a channel layer 13 formed of GaN (film thickness: 100 nm) and an electron-supplying layer 14 formed of AlGaN (film thickness: 30 nm) are deposited on a (0001) plane sapphire substrate 10 by metalorganic chemical vapor deposition (abbreviated to MOCVD).

The lower barrier layer 12 (InAlN) is made to have composition for being lattice-matched to GaN of the upper channel layer 13. A two-dimensional electron gas layer 51 is generated on an interface between the electron supplying layer 14 and the channel layer 13.

An epitaxial layer is partially removed by etching to the depth wherein the lower barrier layer 12 is exposed to form an element isolation mesa.

A metal such as titanium (Ti)/aluminum (Al), as an example, is then deposited by vapor deposition on the electron supplying layer 14 and annealed at 650° C., as an example. By so doing, the source electrode 21 and the drain electrode 22, each having ohmic contact, are formed.

Then, SiN of a film thickness of 100 nm, as an example, is deposited as a protective film 31, using a plasma-enhanced chemical vapor deposition (abbreviated to PECVD).

A part of the protective film 31 is opened by etching. Then, using the protective film 31 as a mask, the semiconductor layer is etched to form a recess 41. The recess 41 is to be of a depth to have the channel layer 13 exposed.

Then, $\text{Al}_2\text{O}_3$ as the gate insulating film 32 is grown to a thickness of 10 nm using an atomic layer deposition (abbreviated to ALD).

Then, on a region in which the recess 41 is formed, metal such as Ni/Au is deposited by vapor deposition to form a gate electrode 23. The field effect transistor shown in FIG. 1 is fabricated in this manner.

In the above example, a case of using a sapphire as the substrate 10, is described only as an example, and SiC or Si may also be used.

The protective film 31 may also be formed of a $\text{SiO}_2$ or a layered structure of SiN and $\text{SiO}_2$, instead of SiN shown as an example above.

As the gate insulating film 32, SiN or $\text{SiO}_2$ may well be used.

Second Exemplary Embodiment

Figure 10:
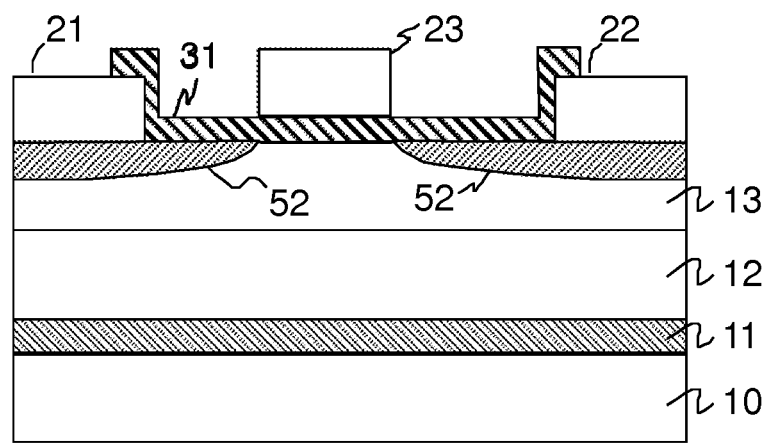
FIG. 10 is a schematic cross-sectional view illustrating a field effect transistor according to a second exemplary embodiment.

FIG. 10 is a diagram illustrating a schematic cross-sectional configuration of a field effect transistor according to a second exemplary embodiment of the present invention. The field effect transistor, shown in FIG. 10, has the following configuration.

A substrate 10 is a sapphire substrate which is a (0001) plane or C-plane substrate;
a buffer layer 11 is formed of GaN or AlGaN;
a lower barrier layer 12 is formed of AlInN; and
a channel layer 13 is formed of GaN.

A source electrode 21 and a drain electrode 22 are disposed spaced to each other, on the channel layer 13, which is an upper most semiconductor layer. The source and drain electrodes 21 and 22 are contacted to the channel layer with ohmic contact.

A high doped n-type region 52 is formed underneath the source electrode 21 and the drain electrode 22 to operate to decrease a resistance of the ohmic contact.

A gate insulating film 32, operating also as a protective film, is formed on a semiconductor surface portion between the source electrode 21 and the drain electrode 22. A gate electrode 23 is formed on the gate insulating film 32.

In the present exemplary embodiment, the gate insulating film is used as an protective film. It is thus possible to form a protective film/semiconductor interface with low trap density.

In addition, a fabrication may be simplified to advantage because the process of processing a protective film or etching a semiconductor may be dispensed with.

In the above example, a case of using GaN as the channel layer 13 is described. Alternatively, as the channel layer, AlGaN or InGaN may be used with the use of a designing technique shown in the first exemplary embodiment.

SiC or Si may also be used as the substrate 10.

For the protective film 31, $\text{SiO}_2$ or a layered structure of SiN and $\text{SiO}_2$ may also be used instead of SiN shown as an example above.

As the gate insulating film 32, SiN or $\text{SiO}_2$ may be used.

The disclosures of the aforementioned Patent Literatures are incorporated by reference herein. The particular Examples may be modified or adjusted within the gamut of the entire disclosure of the present invention, inclusive of claims, based on the fundamental technical concept of the invention. Moreover, a variety of combinations or selection of elements disclosed inclusive of the elements of claims, Examples and the drawings may be made within the concept of the claims. The present invention may encompass a wide variety of modifications or corrections that may occur to those skilled in the art in accordance with the entire disclosure of the present invention, inclusive of claims and the technical concept of the invention.

The invention claimed is:

1. A semiconductor device including a field effect transistor comprising:
   a substrate;
   a lower barrier layer provided on the substrate;
   a channel layer provided on the lower barrier layer;
   an electron supplying layer provided on the channel layer;
   a source electrode and a drain electrode provided on the electron supplying layer; and
   a gate electrode provided between the source electrode and the drain electrode,
   wherein the lower barrier layer includes a composition of $In_{1-z}Al_zN$ ($0 \leq z \leq 1$),
   wherein the channel layer includes a composition of $Al_xGa_{1-x}N$ ($0 \leq x \leq 1$),
   wherein a recess is provided in a region between the source electrode and the drain electrode,
   wherein the recess goes through the electron supplying layer to a depth that exposes the channel layer, and
   wherein the gate electrode is disposed on a gate insulating film that covers a bottom surface and an inner wall surface of the recess.

2. The semiconductor device according to claim 1, wherein the field effect transistor comprises negative surface charges on an interface between the lower barrier layer and the channel layer.

3. The semiconductor device according to claim 1, wherein the lower barrier layer includes a composition of $In_{1-z}Al_zN$ with z being such that $0.76 \leq z \leq 1$.

4. The semiconductor device according to claim 1, wherein the lower barrier layer includes a composition of $In_{1-z}Al_zN$ with z being such that $0 \leq z \leq 0.86$.

5. The semiconductor device according to claim 1, further comprising a buffer layer,
   wherein the buffer layer is provided between the substrate and the lower barrier layer.

6. The semiconductor device according to claim 1, further comprising a protective film,
   wherein the protective film is provided on the electron supplying layer, and
   wherein the gate insulating film covers a surface part of the protective film in a region between the source electrode and the drain electrode.

7. The semiconductor device according to claim 1,
   wherein the channel layer includes a highly doped impurity regions provided underneath the source electrode and the drain electrode, respectively.

8. A semiconductor device including a field effect transistor comprising:
   a substrate;
   a lower barrier layer provided on the substrate;
   a channel layer provided on the lower barrier layer;
   an electron supplying layer provided on the channel layer;
   a source electrode and a drain electrode provided on the electron supplying layer; and
   a gate electrode provided between the source electrode and the drain electrode,
   wherein the lower barrier layer includes a composition of $In_{1-z}Al_zN$ ($0 \leq z \leq 1$),
   wherein the channel layer includes a composition of GaN,
   wherein a recess is provided in a region between the source electrode and the drain electrode,
   wherein the recess goes through the electron supplying layer to a depth that exposes the channel layer, and
   wherein the gate electrode is disposed on a gate insulating film that covers a bottom surface and an inner wall surface of the recess.

9. The semiconductor device according to claim 8,
   wherein the field effect transistor comprises negative surface charges on an interface between the lower barrier layer and the channel layer.

10. The semiconductor device according to claim 8, wherein the lower barrier layer includes a composition of $In_{1-z}Al_zN$ with z being such that $0.76 \leq z \leq 1$.

11. The semiconductor device according to claim 8, wherein the lower barrier layer includes a composition of $In_{1-z}Al_zN$ with z being such that $0 \leq z \leq 0.86$.

12. The semiconductor device according to claim 8, further comprising a buffer layer,
    wherein the buffer layer is provided between the substrate and the lower barrier layer.

13. The semiconductor device according to claim 8, further comprising a protective film,
    wherein the protective film is provided on the electron supplying layer, and
    wherein the gate insulating film covers a surface part of the protective film in a region between the source electrode and the drain electrode.

14. The semiconductor device according to claim 8, wherein the channel layer includes a highly doped impurity regions provided underneath the source electrode and the drain electrode, respectively.

* * * * *